United States Patent
Takeuchi et al.

(10) Patent No.: US 10,516,046 B2
(45) Date of Patent: Dec. 24, 2019

(54) SILICON CARBIDE SEMICONDUCTOR DEVICE

(71) Applicants: DENSO CORPORATION, Kariya, Aichi-pref. (JP); TOYOTA JIDOSHA KABUSHIKI KAISHA, Toyota-shi, Aichi-ken (JP)

(72) Inventors: Yuichi Takeuchi, Kariya (JP); Yu Suzuki, Toyota (JP); Masahiro Sugimoto, Toyota (JP); Yukihiko Watanabe, Nagakute (JP)

(73) Assignees: DENSO CORPORATION, Kariya (JP); TOYOTA JIDOSHA KABUSHIKI KAISHA, Toyota-shi (JP)

(*) Notice: Subject to any disclaimer, the term of this patent is extended or adjusted under 35 U.S.C. 154(b) by 0 days.

(21) Appl. No.: 16/516,329

(22) Filed: Jul. 19, 2019

(65) Prior Publication Data
US 2019/0341484 A1  Nov. 7, 2019

Related U.S. Application Data (63) Continuation of application No. PCT/JP2018/001261, filed on Jan. 17, 2018.

(30) Foreign Application Priority Data

Jan. 27, 2017 (JP) ................. 2017-013182

(51) Int. Cl.
| | |
|---|---|
| H01L 29/78 | (2006.01) |
| H01L 29/16 | (2006.01) |
| H01L 29/06 | (2006.01) |
| H01L 29/10 | (2006.01) |
| H01L 29/40 | (2006.01) |

(Continued)

(52) U.S. Cl.
CPC ........ *H01L 29/7815* (2013.01); *H01L 21/049* (2013.01); *H01L 21/0465* (2013.01); *H01L 21/761* (2013.01); *H01L 21/765* (2013.01); *H01L 29/0623* (2013.01); *H01L 29/0696* (2013.01); *H01L 29/1095* (2013.01); *H01L 29/1608* (2013.01); *H01L 29/407* (2013.01);
(Continued)

(58) Field of Classification Search
CPC combination set(s) only.
See application file for complete search history.

(56) References Cited

U.S. PATENT DOCUMENTS

| | | | |
|---|---|---|---|
| 2015/0129895 A1* | 5/2015 | Takeuchi | ............ H01L 29/4236 257/77 |
| 2015/0333127 A1* | 11/2015 | Morino | ................... H01L 29/78 257/77 |
| 2016/0104794 A1 | 4/2016 | Takeuchi et al. | |

\* cited by examiner

*Primary Examiner* — Ratisha Mehta
(74) *Attorney, Agent, or Firm* — Posz Law Group, PLC (57) ABSTRACT

A silicon carbide semiconductor device includes: a main cell region; a sense cell region; a MOSFET arranged in each of the main cell region and the sense cell region and disposed in a semiconductor substrate having a high impurity concentration layer and a drift layer; an element isolation layer arranged between the main cell region and the sense cell region, and surrounding the sense cell region; and a plurality of electric field relaxation layers arranged between the main cell region and the sense cell region. The MOSFET includes: a base region; a source region; a plurality of deep layers; a trench gate structure; a source electrode; and a drain electrode. The deep layers and the electric field relaxation layers are arranged in a stripe pattern at a predetermined interval.

11 Claims, 9 Drawing Sheets

(51) Int. Cl.
*H01L 29/66* (2006.01)
*H01L 21/04* (2006.01)
*H01L 21/761* (2006.01)
*H01L 21/765* (2006.01)

(52) U.S. Cl.
CPC .... *H01L 29/66068* (2013.01); *H01L 29/7811* (2013.01); *H01L 29/7813* (2013.01)

SILICON CARBIDE SEMICONDUCTOR DEVICE

CROSS REFERENCE TO RELATED APPLICATION

The present application is a continuation application of International Patent Application No. PCT/JP2018/001261 filed on Jan. 17, 2018, which designated the U.S. and claims the benefit of priority from Japanese Patent Application No. 2017-13182 filed on Jan. 27, 2017. The entire disclosures of all of the above applications are incorporated herein by reference.

TECHNICAL FIELD

The present disclosure relates to a silicon carbide (hereinafter referred to as "SiC") semiconductor device in which a vertical MOSFET is divided into a main cell and a sense cell, and a current flowing in the main cell is detected by the sense cell.

BACKGROUND

Conventionally, in a SiC semiconductor device, a semiconductor element is divided into a main cell and a sense cell, and a current flowing in the main cell is detected by the sense cell. In this SiC semiconductor device, by forming an element isolation layer between the main cell and the sense cell, while appropriately performing element isolation between them, the electric field concentration below the element isolation layer is relaxed, and the main cell and the sense cell do not conduct to each other.

SUMMARY

According to an example embodiment, a silicon carbide semiconductor device includes: a main cell region; a sense cell region; a MOSFET arranged in each of the main cell region and the sense cell region and disposed in a semiconductor substrate having a high impurity concentration layer and a drift layer; an element isolation layer arranged between the main cell region and the sense cell region, and surrounding the sense cell region; and a plurality of electric field relaxation layers arranged between the main cell region and the sense cell region. The MOSFET includes: a base region; a source region; a plurality of deep layers; a trench gate structure; a source electrode; and a drain electrode. The deep layers and the electric field relaxation layers are arranged in a stripe pattern at a predetermined interval.

BRIEF DESCRIPTION OF THE DRAWINGS

The above and other objects, features and advantages of the present disclosure will become more apparent from the following detailed description made with reference to the accompanying drawings. In the drawings.

DETAILED DESCRIPTION

In an example semiconductor device, while the element isolation layer is arranged to electrically isolate between the main cell region in which the main cell is formed and the sense cell region in which the sense cell is formed, an electric field relaxation layer is arranged for reducing an electric field concentration at the bottom of the element isolation layer. Further, the electric field relaxation layer is divided into the main cell region side portion and the sense cell region side portion between the element isolation layers. The element isolation layer is formed, for example, by embedding an insulation film in a trench.

However, in the element isolation structure, similarly to the element isolation layer, the electric field relaxation region is formed in a wide area so as to surround the sense cell along the sense cell area and in a wide area along the shape of the main cell area. Therefore, when the electric field relaxation layer is formed by buried epitaxial growth, that is, when a trench is formed at a position where the electric field relaxation layer is to be formed, and epitaxial growth is performed to fill the trench, the embedded region is wide so that a filling failure may occur. Specifically, although the electric field relaxation layer is formed with a certain thickness in the trench, the trench may not be completely filled with the electric field relaxation layer. As a result, the electric field relaxation failure may occur or the breakdown voltage may decrease.

Further, in the element isolation structure, even when the electric field relaxation region is formed by ion implantation, the electric field relaxation region is formed in a wide area having a band shape, so that the ion implantation region has a large area. The large area of the ion implantation region means that the ion dose amount is large, and the crystal damage may be large. Since this damage causes a leakage, when the electric field relaxation region is formed by ion implantation, it is preferable to make the area of the ion implantation region smaller.

A SiC semiconductor device is provided to have a structure capable of suppressing an electric field relaxation failure and a reduction in withstand voltage and suppressing an element damage which causes a leakage.

The SiC semiconductor device according to an example embodiment includes MOSFETs respectively in the main cell region and the sense cell region, is formed between the main cell region and the sense cell region, and is separated into the main cell region side and the sense cell region side. The device includes an element isolation layer surrounding the sense cell region, and an electric field relaxation layer of the second conductivity type formed between the main cell region and the sense cell region to a position deeper than the element isolation layer. In addition to the deep layer provided in the MOSFET, the electric field relaxation layer is formed in a linear shape in which one direction is the longitudinal direction, and a plurality of the electric field relaxation layers are formed in stripes by being arranged at predetermined intervals. Furthermore, the electric field relaxation layer includes at least a first portion protruding from the main cell region side toward the sense cell region side, and a second portion protruding from the sense cell region side toward the main cell region side. In addition, the element isolation layer is formed deeper than the base region, and has an annular structure such that a non-overlapping region continuously surrounds the sense cell region one turn when viewed from the normal direction with respect to the surface of the semiconductor substrate, the non-overlapping region being a part of the element isolation layer other than a region overlapping with the first portion and the second portion. The shortest distance between the first portion and the second portion is set to be equal to or greater than the length of a depletion layer extending from the first portion and the second portion without bias and to be equal to or shorter than a predetermined interval when viewed from the normal direction.

According to such a configuration, the penetration of the electric field between the adjacent electric field relaxation layers can be suppressed, and the penetration of the electric field can also be suppressed between the first portion and the second portion. Therefore, even when the electric field relaxation layer is formed in a linear shape, a desired withstand voltage is obtained.

Then, since the electric field relaxation layer is formed in a linear shape, the formation range of the electric field relaxation layer is not wide when the electric field relaxation layer is formed by the embedded epitaxial growth, so that the embedded defect does not occur. Thus, the electric field relaxation layer is formed properly. When the electric field relaxation layer is formed by ion implantation, the formation range of the electric field relaxation layer is not wide, so that the area of the ion implantation region is reduced. Therefore, it is possible to suppress crystal damage due to ion implantation, and it is also possible to suppress leakage.

Hereinafter, embodiments of the present disclosure will be described with reference to the drawings. In the following embodiments, the same or equivalent parts are denoted by the same reference numerals.

First Embodiment

A first embodiment will be described. Here, a SiC semiconductor device provided with a MOSFET of an inverted trench gate structure as a semiconductor element will be described as an example.

Figure 1:
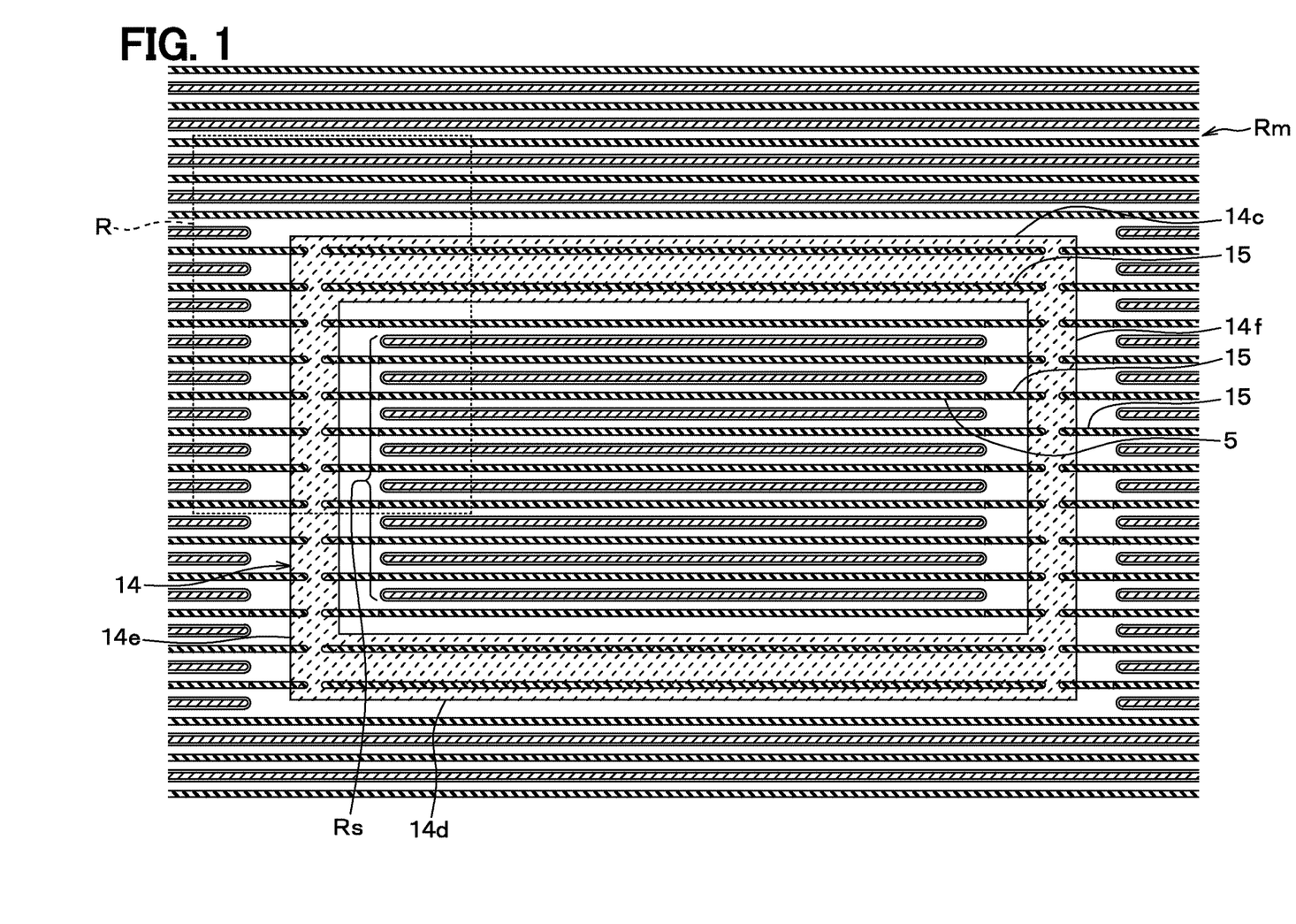
FIG. 1 is a surface layout view of a part of a cell portion of a SiC semiconductor device according to a first embodiment.
Figure 2:
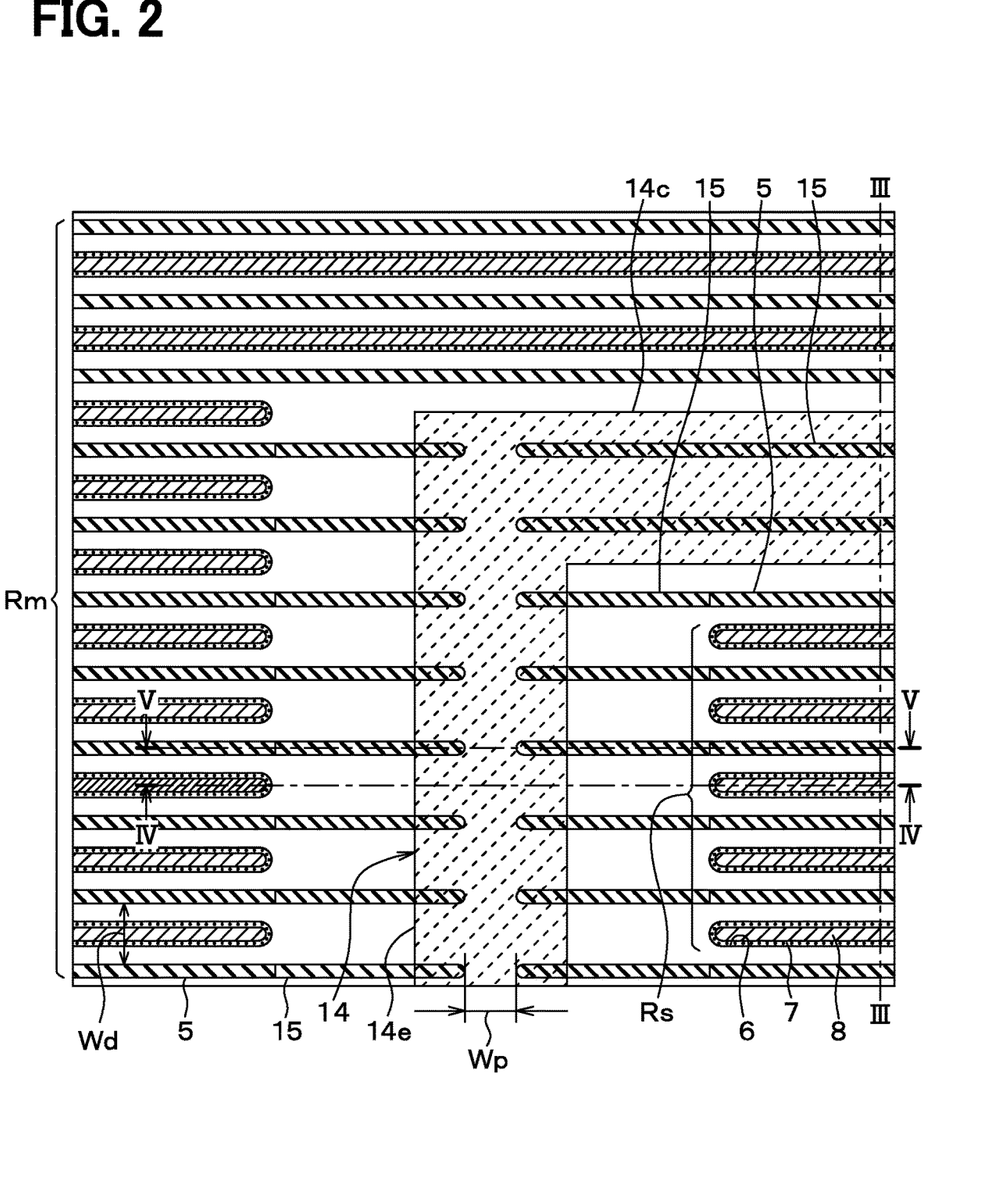
FIG. 2 is an enlarged view of a range R surrounded by a broken line in FIG. 1.

As shown in FIGS. 1 and 2, the SiC semiconductor device according to the present embodiment is configured to have a main cell region Rm and a sense cell region Rs as a cell portion. These main cell region Rm and sense cell region Rs are respectively provided with MOSFETs of the inverted trench gate structure with the same structure. The main cell region Rm and the sense cell region Rs are isolated by an element isolation layer 14 described later, and are electrically isolated from each other. FIG. 1 is an enlarged view of only a part of the main cell region Rm and the sense cell region Rs in the SiC semiconductor device, and FIG. 2 is an enlarged view of a range R indicated by a broken line in FIG. 1. Actually, a SiC semiconductor device is configured by including a cell portion having a main cell region Rm and a sense cell region Rs and an outer peripheral portion having an outer peripheral withstand voltage structure such as a guard ring portion surrounding the cell portion.

Figure 3:
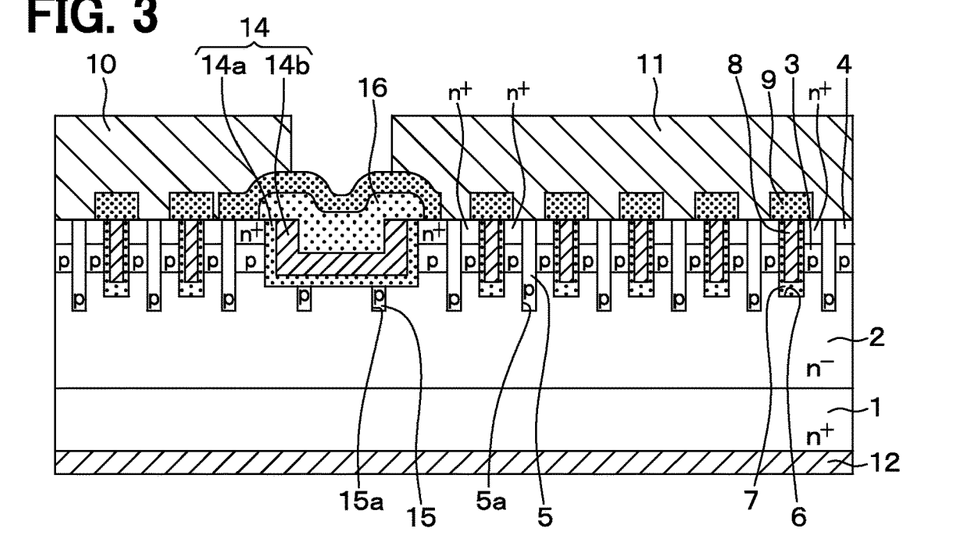
FIG. 3 is a cross-sectional view taken along the line III-III in FIG. 2.
Figure 4:
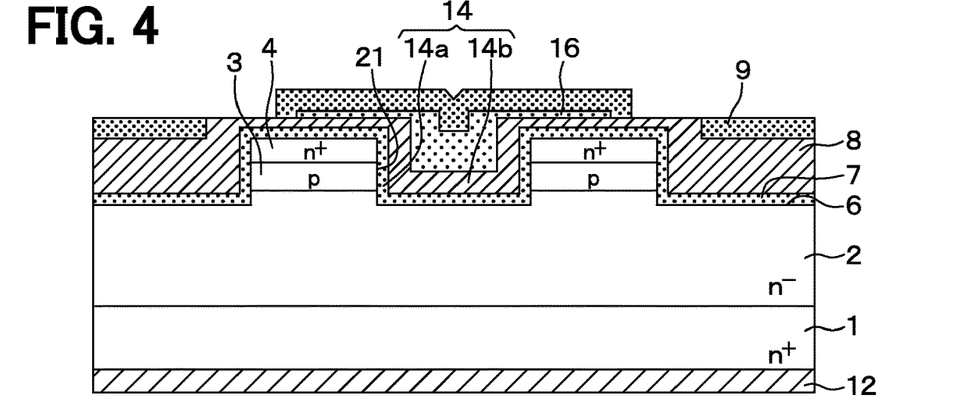
FIG. 4 is a cross-sectional view taken along line IV-IV in FIG. 2.
Figure 5:
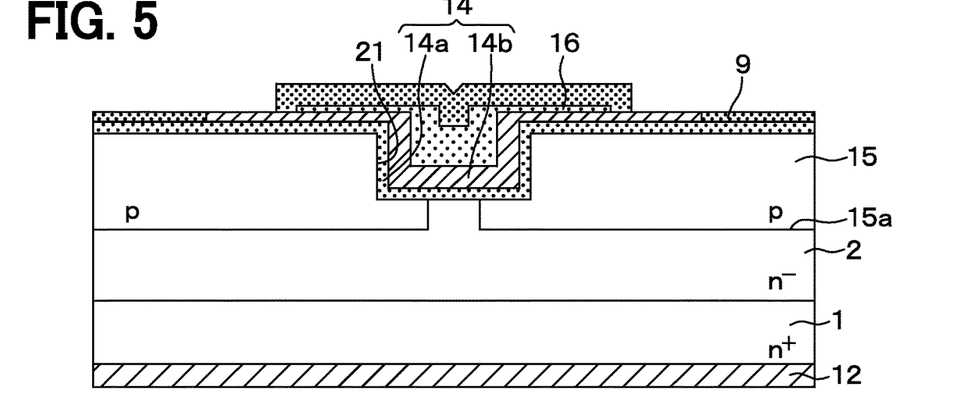
FIG. 5 is a cross-sectional view taken along the line V-V in FIG. 2.

As shown in FIGS. 3 to 5, the SiC semiconductor device is formed with the use of a semiconductor substrate in which an $n^-$ type drift layer 2 made of SiC having an impurity concentration lower than that of an $n^+$ type substrate 1 is epitaxially grown on a front surface of the $n^+$ type substrate 1 configuring a high impurity concentration layer made of SiC. In other words, the semiconductor substrate is used whose back surface side is provided by a high impurity concentration layer on the $n^+$ type substrate 1, and whose front surface side is provided by an $n^-$ type drift layer 2 having an impurity concentration lower than that of the high impurity concentration layer. For example, the $n^+$ type substrate 1 has an n type impurity concentration of $1.0 \times 10^{19}/cm^3$, and its surface is a (0001) Si plane. The $n^-$ type drift layer 2 has, for example, an n type impurity concentration of $0.5 \times 10^{16}/cm^3$ to $2.0 \times 10^{16}/cm^3$.

In the upper portion of the $n^-$ type drift layer 2, a p type base region 3 made of p type SiC and an $n^+$ type source region 4 made of n type SiC are sequentially formed. Furthermore, a trench 5a is formed so as to penetrate the $n^+$ type source region 4 and the p type base region 3, and a p type deep layer 5 is formed so as to fill the inside of the trench 5a.

The trench 5a has a width of, for example, 1 µm or less and a depth of an aspect ratio of 2 or more. The extending direction of the trench 5a, that is, the extending direction of the p type deep layer 5 may be any direction. However, when the trench 5a is extended in the <11-20> direction so that both opposing wall surfaces constituting long sides of the trench 5a are the same (1-100) plane, the embedded epitaxial growth is the same on both walls. Therefore, the film quality can be made uniform and the effect of suppressing the embedding failure can also be obtained.

Further, the p type base region 3 has a portion where a channel region is to be formed, and the portion has the p type impurity concentration of, for example, about $2.0 \times 10^{17}/cm^3$ and the thickness of 300 nm. The $n^+$ type source region 4 has a higher impurity concentration than the $n^-$ type drift layer 2, and has the n type impurity concentration in the surface portion of, for example, $2.5 \times 10^{18}/cm^3$ to $1.0 \times 10^{19}/cm^3$, and the thickness of about 0.5 µm. The $n^+$ type source region 4 is disposed on both sides of a trench gate structure described later. Further, the p type deep layer 5 is provided on the opposite side of the trench gate structure with the $n^+$ type source region 4 sandwiched therebetween, and is formed in a linear shape, and is formed in a stripe shape by arranging a plurality deep layers 5. The p type deep layer 5 is set to have an impurity concentration higher than that of the p type base region 3. For example, the p type impurity concentration of boron or aluminum in the deep layer 5 is, for example, $1.0 \times 10^{17}/cm^3$ to $1.0 \times 10^{19}/cm^3$, and the width thereof is about 0.7 µm and a depth is about 2.0 µm.

In addition, a trench 6 having a longitudinal direction perpendicular to the drawing is formed to penetrate the p type base region 3 and the n⁺ type source region 4 and to reach the n⁻ type drift layer 2. The trench 6 has, for example, a width of 0.8 µm and a depth of 1.0 µm. The above described p type base region 3 and n⁺ type source region 4 are arranged so as to be in contact with the side surface of the trench 6.

Further, a surface portion of the p type base region 3 located between n⁺ type source region 4 and n⁻ type drift layer 2 is used as a channel region, and a gate insulation film 7 is arranged on the inner wall surface of the trench 6 including the channel region. A gate electrode 8 made of doped Poly-Si is formed on the surface of the gate insulation film 7, and the inside of the gate trench 6 is filled with the gate insulation film 7 and the gate electrode 8.

The trench gate structure is configured as described above. This trench gate structure is extended in the vertical direction of the drawing of FIG. 3, in other words, in the left and right direction of FIG. 4. A plurality of trench gate structures are aligned in the right and left direction of the drawing in FIG. 3 to have a stripe pattern. The n⁺ type source region 4 and the p type deep layer 5 described above are also extended along the longitudinal direction of the trench gate structure.

Further, on the surfaces of the n⁺ type source region 4 and the p type deep layer 5 and the surface of the gate electrode 8, the main source electrode 10 and the sense source electrode 11 are formed via the interlayer insulation film 9. The main source electrode 10 and the sense source electrode 11 are made of a plurality of metals such as Ni/Al. N type SiC among a plurality of metals, specifically, at least a portion in contact with the n⁺ type source region 4 and the gate electrode 8 in case of n type impurity doping, is made of a metal capable of ohmic contact with the n type SiC. In addition, at least a portion in contact with p type SiC among the plurality of metals, specifically, in contact with the p type deep layer 5, is made of a metal capable of ohmic contact with the p type SiC.

The main source electrode 10 and the sense source electrode 11 are electrically insulated fro each other by being formed on the interlayer insulation film 9. The main source electrode 10 and the sense source electrode 11 are electrically connected to the n⁺ type source region 4 and the p type deep layer 5 of the main cell region Rm and the sense cell region Rs, respectively, through the contact holes formed in the interlayer insulation film 9.

Further, a drain electrode 12 electrically connected to the n⁺ type substrate 1 is formed on a back surface of the n⁺ type substrate 1. With such a structure, an n channel type inverted trench gate MOSFET is formed, and a MOSFET of the same structure is formed in each of the main cell region Rm and the sense cell region Rs. Then, the cell areas of the inversion type MOSFETs provided in the main cell region Rm and the sense cell region Rs, in other words, the number of cells, are made to have a predetermined ratio.

In addition, the element isolation layer 14 is formed between the main cell region Rm and the sense cell region Rs from the surface of the p type base region 3 to a position deeper than the p type base region 3. The element isolation layer 14 isolates elements between the main cell region Rm and the sense cell region Rs, that is, electrically isolates them. For example, the silicon layer 14b is stacked on the insulation film 14a such as an oxide film, similar to the trench gate structure.

The element isolation layer 14 has a frame shape formed in a belt shape between the main cell region Rm and the sense cell region Rs, and in the present embodiment, as shown in FIG. 1, the layer 14 is constructed to have a square shape surrounding the sense cell region Rs, more specifically, the layer 14 is configured in a rectangular frame shape. Two opposing sides 14c and 14d of the element isolation layer 14 having the rectangular shape are sides along the longitudinal direction of the trench gate structure, and remaining two sides 14e and 14f are orthogonal to the longitudinal direction of the trench gate structure.

Further, in a part of the main cell region Rm adjacent to the sense cell region Rs and in a part of sense cell region Rs adjacent to the main cell region Rm, a portion in which no cell of the MOSFET is formed is arranged. In this portion, an electric field relaxation layer 15 corresponding to a first electric field relaxation layer formed of a p type layer extending downward from at least the p type base region 3 is formed. In the case of the present embodiment, the electric field relaxation layer 15 has the same structure as the p type deep layer 5, i.e., is configured by embedding and epitaxially growing a p type layer in the trench 15a. A plurality of straight line shape layers 15 are arranged in a stripe shape.

Specifically, the p type deep layer 5 is disposed to face the side surface of the trench 6 which is in parallel to the longitudinal direction. A part of the electric field relaxation layer 15 is formed to be connected to the p type deep layer 5. That is, a part of the electric field relaxation layer 15 is constituted by a portion in which the p type deep layer 5 is extended in the left-right direction of the drawing in FIG. 2 and protrudes from the trench gate structure. A part of the electric field relaxation layer 15 is formed to reach the bottoms of the sides 14e and 14f of the element isolation layer 14 and to exceeds the main cell region Rm and the sense cell region Rs. In the electric field relaxation layer 15, a portion of the electric field relaxation layer 15 arranged to protrude from the main cell region Rm side to the sense cell region Rs side corresponds to a first portion, and a portion of the electric field relaxation layer 15 arranged to protrude from the sense cell region Rs side to the main cell region Rm side corresponds to a second portion.

Both of the portion of the electric field relaxation layer 15 corresponding to the first portion protruding from the main cell region Rm side and the portion of the electric field relaxation layer 15 corresponding to the second portion protruding from the sense cell region Rs side are formed to the positions reaching the bottoms of the sides 14e and 14f of the element isolation layer 14. However, both are arranged so as to terminate at positions separated from each other. Therefore, the electric field relaxation layer 15 on the main cell region Rm side and the electric field relaxation layer 15 on the sense cell region Rs side are electrically separated, and the main cell region Rm and the sense cell region Rs are not conducted to each other through the electric field relaxation layer 15.

Further, the remaining part of the electric field relaxation layer 15 is arranged between the main cell region Rm and the sense cell region Rs, and is designed to have a length equal to a combined length of the p type deep layer 5 and an above described part of the electric field relaxation layer 15. In the case of this embodiment, the remaining part of the electric field relaxation layer 15 is disposed at equal intervals to the p type deep layer 5 of the main cell region Rm and the sense cell region Rs.

The depth and the impurity concentration of the electric field relaxation layer 15 may be any. It is preferable that the electric field relaxation layer 15 has a sufficient depth and a sufficiently high impurity concentration in order to reduce electric field concentration. In the present embodiment, the electric field relaxation layer 15 has the same impurity concentration and the same depth as the p type deep layer 5.

Furthermore, in the case of the present embodiment, the portion of the electric field relaxation layer 15 protruding from the main cell region Rm side and the portion of the electric field relaxation layer 15 protruding from the sense cell region Rs side are arranged in a straight line, and tips of both portions are arranged to face each other so as to butt tops with each other. And as shown in FIG. 2, the distance Wp is provided between tips thereof. The distance Wp is set to be equal to or less than the distance Wd between the adjacent p type deep layers 5 and the adjacent electric field relaxation layers 15. In the present embodiment, the distance Wp is smaller than the distance Wd. Furthermore, the distance Wd is set to be equal to or longer than the length of the depletion layer extending from the electric field relaxation layer 15 when no bias is applied. That is, the shortest distance between the electric field relaxation layer 15 protruding from the main cell region Rm side and the electric field relaxation layer 15 protruding from the sense cell region Rs side is set to be equal to or longer than the length of the depletion layer extending from the electric field relaxation layer 15 when no bias is applied. As a result, it is possible to ensure insulation between the main cell region Rm and the sense cell region Rs and to suppress the penetration of the electric field when turning off.

Further, in the case of the present embodiment, both widths of the element isolation layer 14 between the sides 14c and 4d and between the sides 14e and 14f are wider than the distance Wd between the adjacent p type deep layers 5 and the adjacent electric field relaxation layers 15. Therefore, at least one electric field relaxation layer 15 is disposed at the bottom of the sides 14c and 14d, and in FIG. 2, two electric field relaxation layers 15 are arranged.

As described above, since the electric field relaxation layer 15 is disposed at the bottom of the element isolation layer 14, the electric field concentration at the bottom of the element isolation layer 14 can be sufficiently relaxed by the electric field relaxation layer 15 so that the sufficient withstand voltage structure is obtained. Further, in the region where the main cell region Rm, the sense cell region Rs and the element isolation layer 14 are formed, the p type layers such as the p type deep layer 5 and the electric field relaxation layer 15 are arranged at equal intervals. Therefore, the rise of the high electric field when the MOSFET turns off, that is, the penetration of the electric field between the p type deep layers 5 and between the electric field relaxation layers 15 is suppressed over the entire cell area, and a desired breakdown voltage is obtained.

More specifically, the element isolation layer 14 has a non-overlapping region except for a region overlapping with the portion of the electric field relaxation layer 15 that protrudes from the main cell region Rm side and the portion of the electric field relaxation layer 15 that protrudes from the sense cell region Rs side when viewed in the normal direction with respect to the surface of the semiconductor substrate. Then, the electric field relaxation layer 15 is disposed such that this non-overlapping region has an annular structure that continuously surrounds the sense cell region Rs in one turn. Furthermore, the shortest distance between the portion of the electric field relaxation layer 15 that protrudes from the main cell region Rm side and the portion of the electric field relaxation layer 15 that protrudes from the sense cell region Rs side when viewed in the normal direction with respect to the surface of the semiconductor substrate is equal to or longer than the length of the depletion layer extending from the relaxation layer 15 when no bias is applied and equal to or less than the distance Wd. This makes it possible to obtain the above effects.

In addition, an interlayer insulation film 9 is formed on the element isolation layer 14 via the field oxide film 16. Then, for example, the main source electrode 10 and the sense source electrode 11 are separated from each other above the element isolation layer 14, and are independently connected to external elements.

Although not shown, contact holes are formed in interlayer insulation film 9 in the portion of the main cell region Rm near the sense cell region Rs and the portion of the sense cell region Rs near the main cell region Rm. The electric field relaxation layer 15 is connected to the main source electrode 10 or the sense source electrode 11 through the contact hole. As a result, the electric field relaxation layer 15 is fixed to each source electrode potential as in the p type deep layer 5.

As described above, the SiC semiconductor device is configured such that the inversion type MOSFETs having the same trench gate structure are arranged in the main cell region Rm and the sense cell region Rs. When a gate voltage is applied to the gate electrode 8, a channel is formed on the surface of the p type base region 3 in contact with the trench 6 in the inversion type MOSFET with the trench gate structure arranged in the SiC semiconductor device. As a result, the electrons injected from the main source electrode 10 and the sense source electrode 11 flow from the n$^+$ type source region 4 through the channel, and a current flows between the main source electrode 10 or the sense source electrode 11 and the drain electrode 12.

Then, such an inverted MOSFET is formed in each of the main cell region Rm and the sense cell region Rs, and the cell areas of the MOSFET provided in the main cell region Rm and the sense cell region Rs are set to have a predetermined ratio. For this reason, it is possible to flow a current, obtained by reducing the current flowing in the main cell region Rm with a predetermined ratio, in the sense cell region Rs. Therefore, by outputting the current flowing in the sense cell region Rs to the outside, the current flowing in the main cell region Rm is detected.

In the SiC semiconductor device having such a configuration, as described above, while the element isolation layer 14 is provided to electrically isolate between the main cell region Rm and the sense cell region Rs, the electric field relaxation layer 15 is provided so as to reduce electric field concentration occurred at the bottom of the element isolation layer 14. Furthermore, the electric field relaxation layer 15 is formed in a linear shape.

As described above, when the electric field relaxation layer 15 has a linear shape, the breakdown voltage may drop due to the penetration of an electric field between the electric field relaxation layers 15 adjacent to each other or between the electric field relaxation layer 15 protruding from the main cell region Rm side and the electric field relaxation layer 15 protruding from the sense cell region Rs side. However, since the adjacent electric field relaxation layers 15 are formed to have a same distance as the distance Wd of the adjacent p type deep layers 5, the penetration of the electric field is suppressed. Also, the distance Wp between the electric field relaxation layer 15 protruding from the main cell region Rm side and the electric field relaxation layer 15 protruding from the sense cell region Rs side is set to be equal to or less than the distance Wd of the adjacent p type deep layers 5. Therefore, the penetration of the electric field is suppressed also between them. Therefore, even when the electric field relaxation layer 15 is formed in a linear shape, the withstand voltage is secured.

Therefore, as described later, when the electric field relaxation layer 15 is formed by the embedded epitaxial growth, the formation range of the electric field relaxation layer 15 is not wide, so that the electric field relaxation layer 15 is accurately formed without generating the embedding failure. Therefore, it is possible to suppress the reduction in the breakdown voltage without causing a shortage in electric field relaxation, so that the SiC semiconductor device having a desired breakdown voltage is formed.

In addition, the electric field relaxation layer 15 may be formed by ion implantation. Also in this case, since the formation range of the electric field relaxation layer 15 is not wide, the area of the ion implantation region is reduced. Therefore, it is possible to suppress crystal damage due to ion implantation, and it is also possible to suppress leakage.

Furthermore, the shortest distance between the electric field relaxation layer 15 protruding from the main cell region Rm side and the electric field relaxation layer 15 protruding from the sense cell region Rs side is set to be equal to or longer than the length of the depletion layer extending from the electric field relaxation layer 15 when no bias is applied. Therefore, it is possible to secure insulation between the main cell region Rm and the sense cell region Rs and to suppress the penetration of the electric field in case of an off state, and a desired withstand voltage is obtained.

Subsequently, a method of manufacturing a SiC semiconductor device according to the present embodiment will be described with reference to FIGS. 6A to 6F. However, in the method of manufacturing the SiC semiconductor device according to this embodiment, the process other than a step of forming the element isolation layer 14 and a feature such that the electric field relaxation layer 15 is formed simultaneously with the p type deep layer 5 is similar to a conventional method. Therefore, the formation step of the electric field relaxation layer 15 and the formation process of the element isolation layer 14 will be mainly described, and the description of the other parts will be omitted. FIGS. 6A to 6F show a cross section of FIG. 5, that is, a cross section of the line V-V in FIG. 2.

Figure 6A:
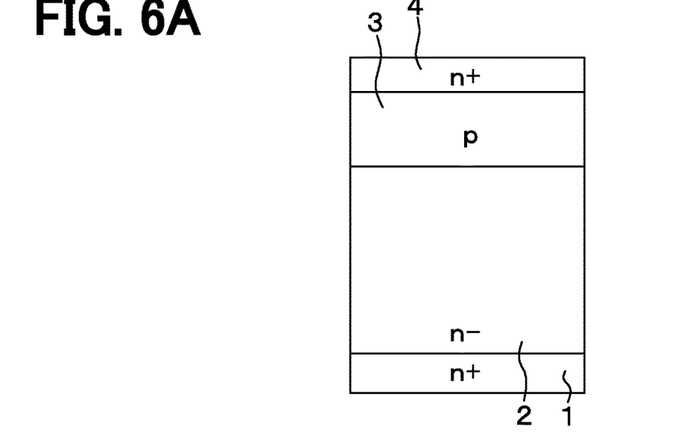
FIG. 6A is a cross-sectional view showing a manufacturing process of the SiC semiconductor device shown in FIG. 1.

[Process Shown in FIG. 6A]

First, an n$^+$ type substrate 1 is prepared, and an n$^-$ type drift layer 2 made of SiC is epitaxially grown on the surface of the n$^+$ type substrate 1. Alternatively, a so-called epitaxial substrate is prepared in which an n$^-$ type drift layer 2 made of SiC is preliminarily and epitaxially grown on the surface of the n$^+$ type substrate 1. In this way, the semiconductor substrate is prepared such that a high impurity concentration layer provided by the n$^+$ type substrate 1 is disposed on the back side and an n$^-$ drift layer 2 having the impurity concentration lower than that of the high impurity concentration layer is disposed on the front side.

Furthermore, a p type base region 3 is formed by epitaxially growing a p type impurity layer on the surface of the n$^-$ type drift layer 2. Further, the n$^+$ type source region 4 is formed on the p type base region 3.

Figure 6B:
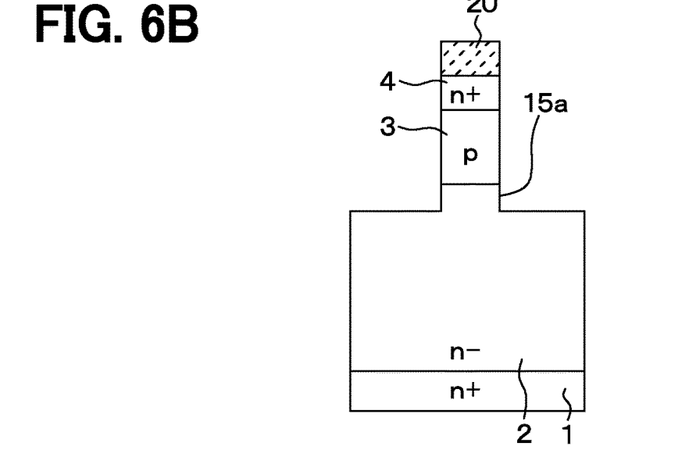
FIG. 6B is a cross-sectional view showing a manufacturing process of the SiC semiconductor device continued from FIG. 6A.

[Process Shown in FIG. 6B]

After a mask 20 made of a resist or the like is formed on the surface of the n$^+$ type source region 4, the mask 20 is opened in a region where the p type deep layer 5 and the electric field relaxation layer 15 are to be formed in a photo-lithography process. Then, etching is performed using the mask 20 to form the trench 15a and, although not shown, to form the trench 5a.

Figure 6C:
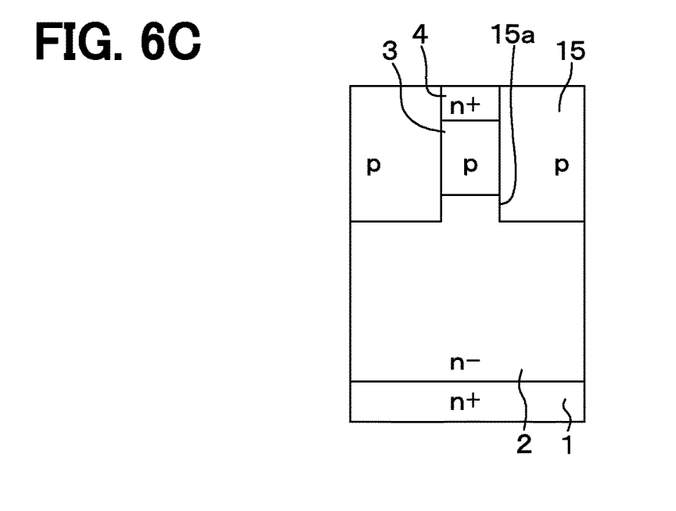
FIG. 6C is a cross-sectional view showing a manufacturing process of the SiC semiconductor device continued from FIG. 6B.

[Process Shown in FIG. 6C]

After removing the mask 20, a p type layer is embedded and epitaxially grown, and the grown layer is etched back to remain the p type layer in the trenches 5a and 15a. Thereby, the electric field relaxation layer 15 is formed, and the p type deep layer 5 is formed although not shown in the drawing.

Figure 6D:
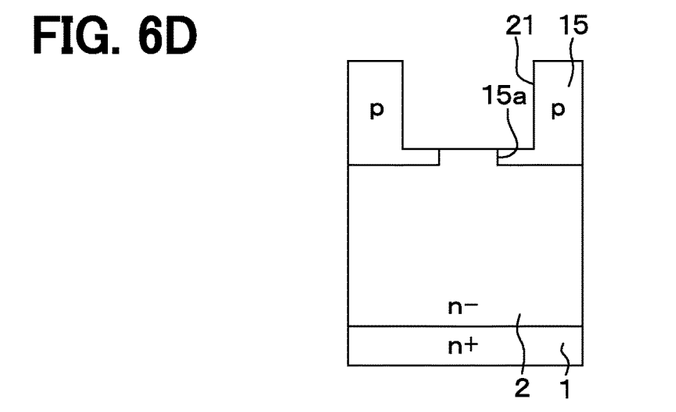
FIG. 6D is a cross-sectional view showing a manufacturing process of the SiC semiconductor device continued from FIG. 6C.

[Process Shown in FIG. 6D]

After forming an etching mask not shown on the surface of the n$^+$ type source region 4, the p type deep layer 5 and the electric field relaxation layer 15, the etching mask is opened in a region where the element isolation layer 14 is to be formed. Further, although not shown, at the same time, the etching mask is opened in the region where the trench 6 is to be formed in the main cell region Rm and the sense cell region Rs. Then, after performing anisotropic etching using an etching mask, if necessary, an isotropic etching and a sacrificial oxidation step are performed to form the trench 6 and also to form the trench 21 at a position where the element isolation layer 14 is to be formed simultaneously. After that, the etching mask is removed. Since the trench 21 is formed together with the trench 6 in this manner, they can be made to have the same depth, and the depth of the trench gate structure formed in the trench 6 and the depth of the element isolation layer 14 formed in the trench 21 can be the same. Further, since these are formed in the same process, a variation of a characteristic is small, and it also becomes possible to reduce a manufacturing cost by simplifying a manufacturing process.

Figure 6E:
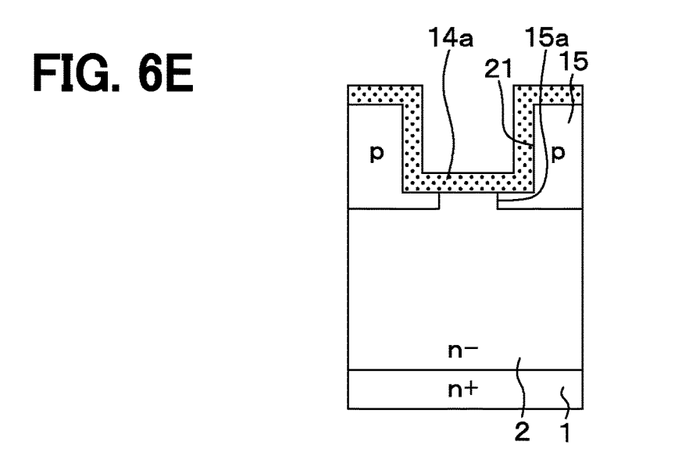
FIG. 6E is a cross-sectional view showing a manufacturing process of the SiC semiconductor device continued from FIG. 6D.

[Process Shown in FIG. 6E]

The formation process of the gate insulation film 7 and the formation process of the element isolation layer 14 are performed simultaneously. Specifically, thermal oxidation is performed by a pyrogenic method using a wet atmosphere, and then an oxide film is formed by a CVD method so as to fill the inside of the trenches 6 and 21. Then, a mask not shown is arranged, and a portion of the mask corresponding to the trench 6 is opened by a photolithography process. Thereafter, anisotropic etching is performed using a mask to partially remove the oxide film inside the trench 6. As a result, the oxide film is left on the sidewall and the bottom of the trench 6 to have a predetermined thickness, and the gate insulation film 7 is formed. At this time, since the oxide film formed in the trench 21 is covered by the mask, the oxide film in the trench 21 remains even after partially removing the oxide film in the trench 6, so that the insulation film 14a of the element isolation layer 14 is formed of this oxide film.

The insulation film 14a formed at this time is made to remain thicker than the gate insulation film 7. As described later, since the polysilicon layer 14b is formed by using polysilicon at the time of forming the gate electrode 8, a structure may be formed to connect these elements. In such a case, when a gate voltage is applied to the gate electrode 8, the gate voltage is also applied to the polysilicon layer 14b, so that a parasitic transistor may turn on. However, by making the insulation film 14a to be thicker than the gate insulation film 7, the threshold voltage is increased, and the parasitic transistor is suppressed from turning on. Therefore, dielectric breakdown of the insulation film 14a by the drain electric field at the time of turning off can be prevented.

Figure 6F:
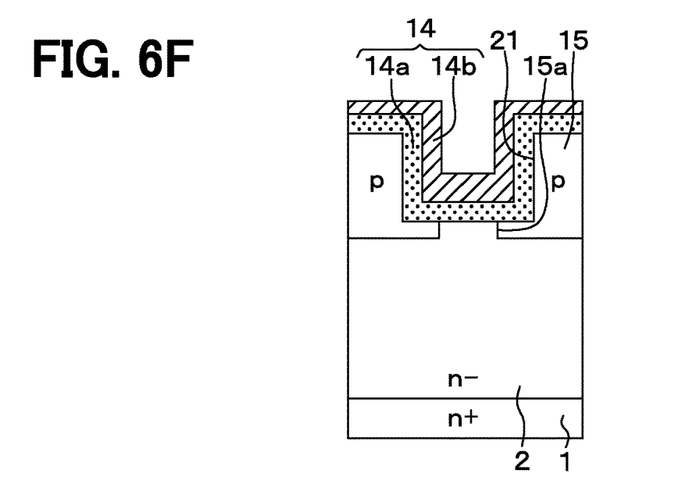
FIG. 6F is a cross-sectional view showing a manufacturing process of the SiC semiconductor device continued from FIG. 6E.

[Step Shown in FIG. 6F]

After forming a polysilicon layer on the surfaces of the gate insulation film 7 and the insulation film 14a, the gate electrode 8 is formed on the surface of gate insulation film 7 in trench 6 by performing an etch back process and the like, and the polysilicon layer 14b is formed on the surface of the insulation film 14a.

Although the subsequent steps are similar to a conventional art and are not shown, the following steps are performed. Specifically, after forming the field oxide film 16 and the interlayer insulation film 9, the interlayer insulation film 9 is patterned to form a contact hole connecting to the n+ type source region 4 or the p type deep layer 5, and to form a contact hole connecting to a gate electrode 8 in another cross section. Subsequently, an electrode material is deposited to fill the inside of the contact hole, and then patterned to form the source electrode 10 and the gate wiring. In addition, the drain electrode 12 is formed on the back side of the n+ type substrate 1. Thereby, the SiC semiconductor device having the inversion type MOSFET of this embodiment is completed.

The SiC semiconductor device according to the present embodiment can be manufactured by the manufacturing method described above.

When manufacturing the SiC semiconductor device according to such a manufacturing method, it is necessary to arrange a space between the electric field relaxation layer 15 protruding from the main cell region Rm side and the electric field relaxation layer 15 protruding from the sense cell region Rs side at the bottom of the element isolation layer 14. When the longitudinal direction of the p type deep layer 5 and the electric field relaxation layer 15 is the <11-20> direction, the influence of an epitaxial facet surface formed when the p type layer is embedded in the trenches 5a and 15a may cause a mask misalignment in the same direction. Therefore, the width Wd of the element isolation layer 14 is set to be equal to or more than the length obtained by adding the amount of mask deviation to the distance Wp.

Further, in the case of the present embodiment, the width Wd of the element isolation layer 14 is made wider than the distances Wd between the adjacent p type deep layers 5 and between adjacent electric field relaxation layers 15. In the direction orthogonal to the longitudinal direction of the p type deep layer 5 and the electric field relaxation layer 15, the mask misalignment due to the influence of the epitaxial facet surface may not occur in the element isolation layer 14. However, by setting the width Wd of the element isolation layer 14 to the above-described value, at least one of the electric field relaxation layers 15 is positioned at the bottom of the sides 14c and 14d of the element isolation layer 14 even if mask misalignment occurs. Therefore, also on the sides 14c and 14d of the element isolation layer 14, the electric field relaxation effect by the electric field relaxation layer 15 can be reliably obtained.

Second Embodiment

The second embodiment will be described. The present embodiment is similar to the first embodiment except that the width of the element isolation layer 14 is changed with respect to the first embodiment, and therefore features different from the first embodiment will be mainly described.

Figure 7:
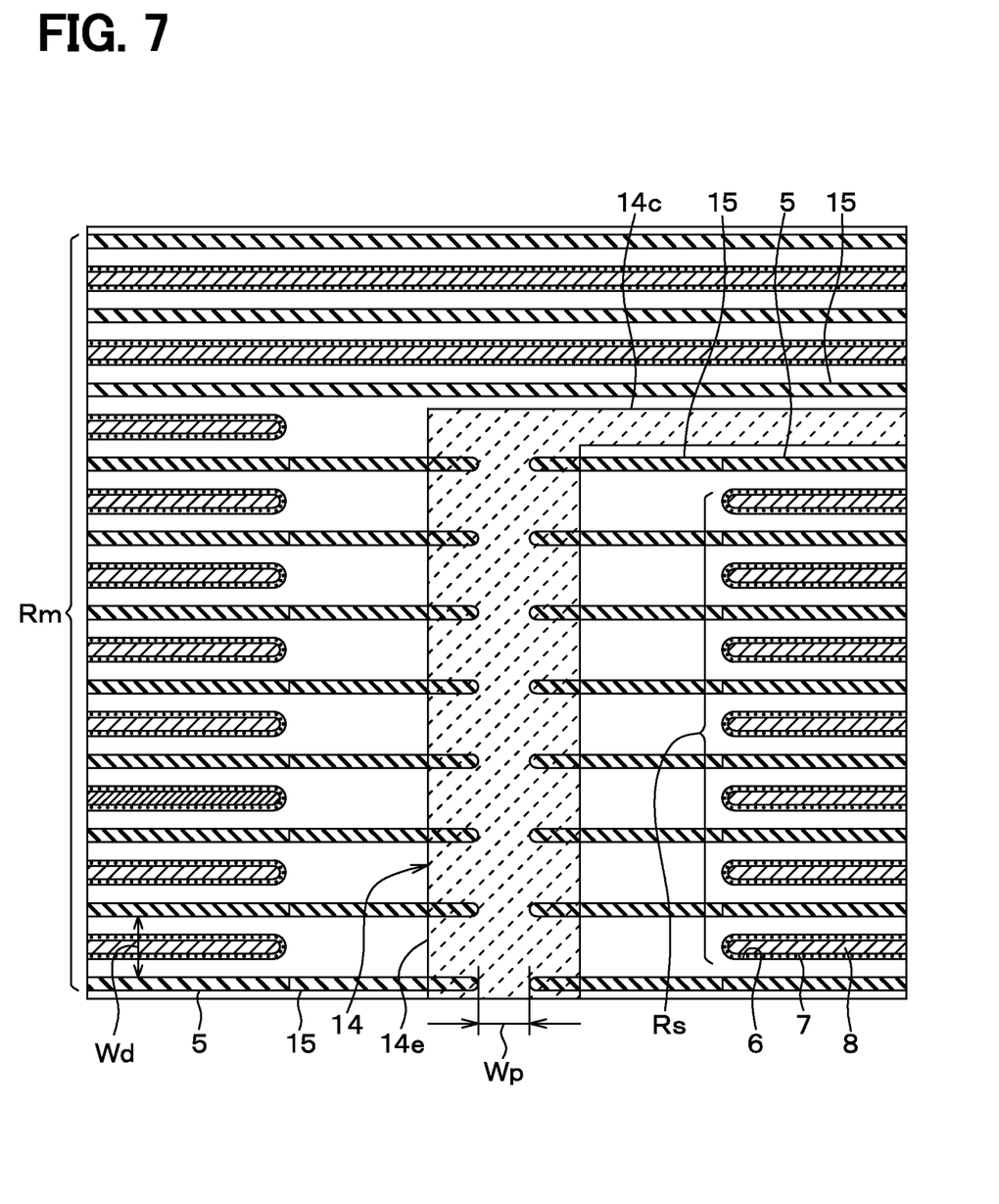
FIG. 7 is a surface layout view of a part of a cell portion of a SiC semiconductor device according to a second embodiment.

As shown in FIG. 7, in the present embodiment, the widths of the sides 14c and 14d of the element isolation layer 14 are made narrower than the widths of the sides 14e and 14f, and made narrower than the distance Wd between the adjacent p type deep layers 5 and between the electric field relaxation layers 15. Although only the side 14c and the side 14e are shown in FIG. 7, the widths of the side 14d and the side 14f are set so as to have the relationship described above.

In the first embodiment, the electric field relaxation layer 15 is always disposed at the bottom of the sides 14c and 14d of the element isolation layer 14. In the second embodiment, the sides 14c and 14d of the element isolation layer 14 are arranged between adjacent electric field relaxation layers 15.

As described above, the epitaxial facet surface formed in the p type layer for forming the p type deep layer 5 and the electric field relaxation layer 15 has an influence over the mask misalignment in the <11-20> direction, but less influence in the direction orthogonal to the <11-20> direction. Therefore, the formation position of the element isolation layer 14 may be deviated from the desired position in the <11-20> direction, but is formed substantially at the desired position in the orthogonal direction. Therefore, as in the present embodiment, the sides 14c and 14d of the element isolation layer 14 can be formed between the adjacent electric field relaxation layers 15.

As described above, the sides 14c and 14d of the element isolation layer 14 may be formed between the adjacent electric field relaxation layers 15. Even in such a configuration, the distance Wd between the adjacent electric field relaxation layers 15 is equal to the distance between the p type deep layers 5 and is set to a certain value for suppressing the penetration of the electric field, so that it is possible to maintain the withstand voltage.

Third Embodiment

A third embodiment will be described. The present embodiment is similar to the first and second embodiments except that the electric field relaxation structure is modified with respect to the first and second embodiments. Features different from the first and second embodiments will be mainly explained. Although the SiC semiconductor device according to the present embodiment will be described here as a modification to the structure of the first embodiment, the same may apply to the second embodiment.

Figure 8:
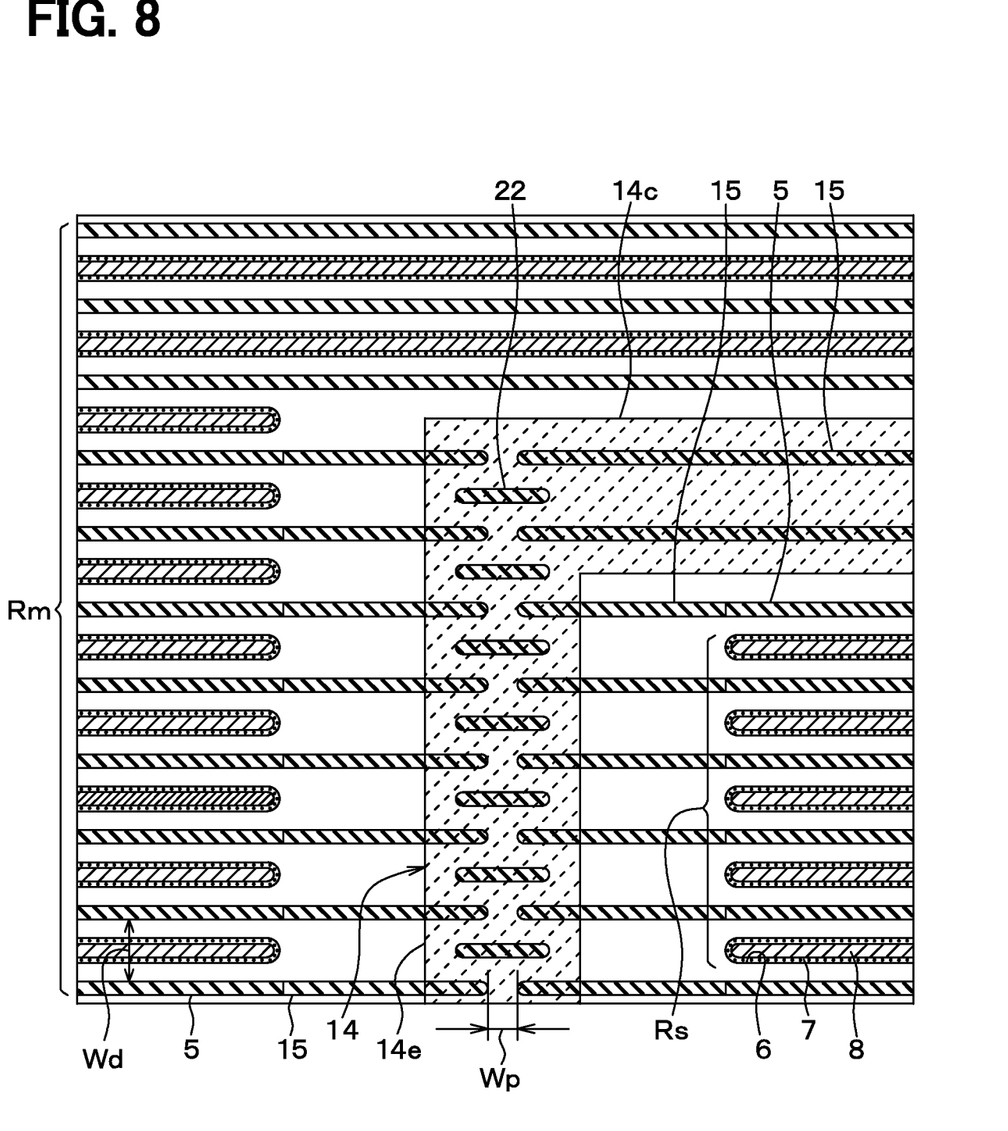
FIG. 8 is a surface layout view of a part of a cell portion of a SiC semiconductor device according to a third embodiment.

As shown in FIG. 8, as in the first embodiment, the electric field relaxation layers 15 are formed to extend from the p type deep layer 5 and at equal intervals in an area where the element isolation layer 14 is formed. Furthermore, in the present embodiment, an electric field relaxation layer 22 corresponding to the second electric field relaxation layer is formed at a position corresponding to an area between the electric field relaxation layer 15 protruding from the main cell region Rm side and the electric field relaxation layer 15 protruding from the sense cell region Rs side. The electric field relaxation layer 22 is formed at the bottom of the sides 14e and 14f of the element isolation layer 14, and the upper surface shape thereof is an island shape. In the case of this embodiment, the shape is an oval island shape, so that the layer 22 is in a floating state.

As described above, the electric field relaxation layer 22 is formed at a portion where the distance from the p type layer is farthest, that is, formed in the peripheral region between the electric field relaxation layer 15 protruding from the main cell region Rm and the electric field relaxation layer 15 protruding from the sense cell. Thereby, in this region, it is possible to narrow the interval of the portion where the p type layer is not disposed, and it is possible to suppress the rise of the electric field between the p type layers. Thus, the withstand voltage of the SiC semiconductor device can be further improved.

Even in the configuration in which the electric field relaxation layer 22 is formed as in the present embodiment, the non-overlapping region of the element isolation layer except for the overlapping region of the first portion and the second portion has an annular structure continuously surrounding the sense cell region in one turn when viewing in the normal direction to the surface of the semiconductor substrate. Further, the electric field relaxation layer 15 protruding from the main cell region Rm side and the electric field relaxation layer 15 protruding from the sense cell region Rs side are set to be equal to or longer than the depletion layer length extending from the electric field relaxation layer 15 when no bias is applied. Similarly, the shortest distance between each of the electric field relaxation layers 15 and the electric field relaxation layers 22 is also set to be equal to or longer than the depletion layer length extending from the electric field relaxation layer 15 and the electric field relaxation layer 22 when no bias is applied. As a result, it is possible to ensure insulation between the main cell region Rm and the sense cell region Rs and to suppress the penetration of the electric field when turning off.

Fourth Embodiment

A fourth embodiment will be described. In the present embodiment, the configurations of the p type deep layer 5 and the electric field relaxation layer 15 are modified with respect to the first and second embodiments, and the other configurations are similar to the first and second embodiments. Features different from the first and second embodiments will be mainly described. Although the SiC semiconductor device according to the present embodiment will be described here as a modification to the structure of the first embodiment, the same may apply to the second embodiment.

Figure 9:
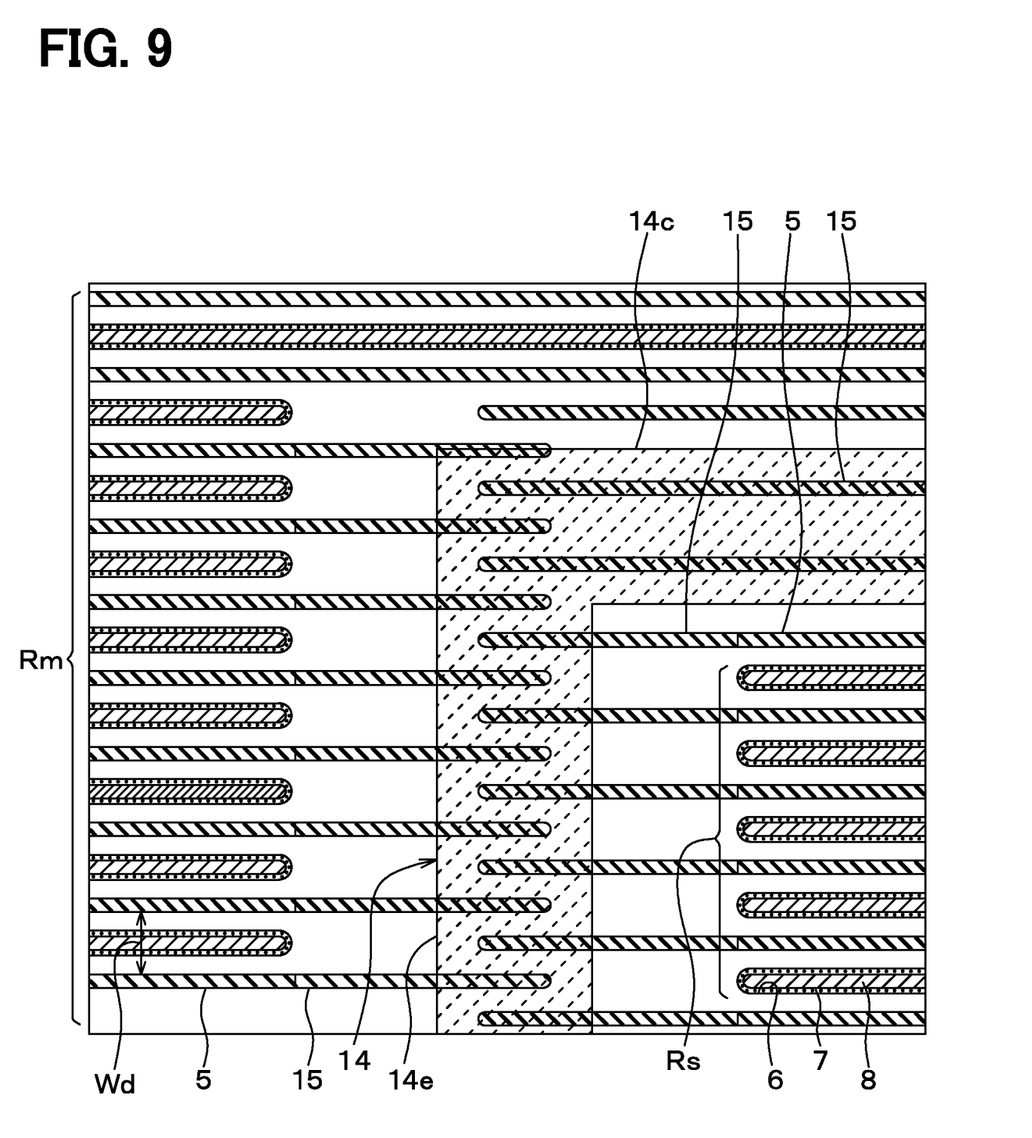
FIG. 9 is a surface layout view of a part of a cell portion of a SiC semiconductor device according to a fourth embodiment.

As shown in FIG. 9, as in the first embodiment, the p type deep layers 5 and the electric field relaxation layers 15 are formed in both the main cell region Rm and sense cell region Rs to have a stripe shape by arranging a plurality of straight line shaped layers. Furthermore, in this embodiment, the p type deep layers 5 and the electric field relaxation layers 15 in the main cell region Rm and the p type deep layers 5 and the electric field relaxation layers 15 in the sense cell region Rs are respectively shifted in the direction orthogonal to the longitudinal direction thereof, and each of them are arranged alternately. Further, the tip of the electric field relaxation layer 15 on the main cell region Rm side is inserted into the tip of the electric field relaxation layer 15 on the sense cell region Rs side, and the side surfaces of both tips are opposed to each other.

As described above, the p type deep layers 5 and the electric field relaxation layers 15 may be shifted in the direction orthogonal to the longitudinal direction in the main cell region Rm and the sense cell region Rs, and may be alternately arranged respectively. In this way, compared to the case where the electric field relaxation layer 15 protruding from the main cell region Rm side and the electric field relaxation layer 15 protruding from the sense cell region Rs side are opposed to each other as in the first embodiment, respective interval between the electric field relaxation layers 15 can be narrowed. Thereby, the rise of the electric field between the electric field relaxation layers 15 can be further suppressed, and the withstand voltage of the SiC semiconductor device can be further improved.

Even in the case of the configuration of the present embodiment, the shortest distance between the electric field relaxation layer 15 protruding from the main cell region Rm side and the electric field relaxation layer 15 protruding from the sense cell region Rs side is set to be equal to or longer than the length of the depletion layer which extends from the electric field relaxation layer 15 when no bias is applied. As a result, it is possible to ensure insulation between the main cell region Rm and the sense cell region Rs and to suppress the penetration of the electric field when turning off.

Fifth Embodiment

A fifth embodiment will be described. The present embodiment is similar to the first embodiment except that the configuration of the element isolation layer 14 is changed with respect to the first embodiment, and therefore features different from the first embodiment will be mainly described.

Figure 10:
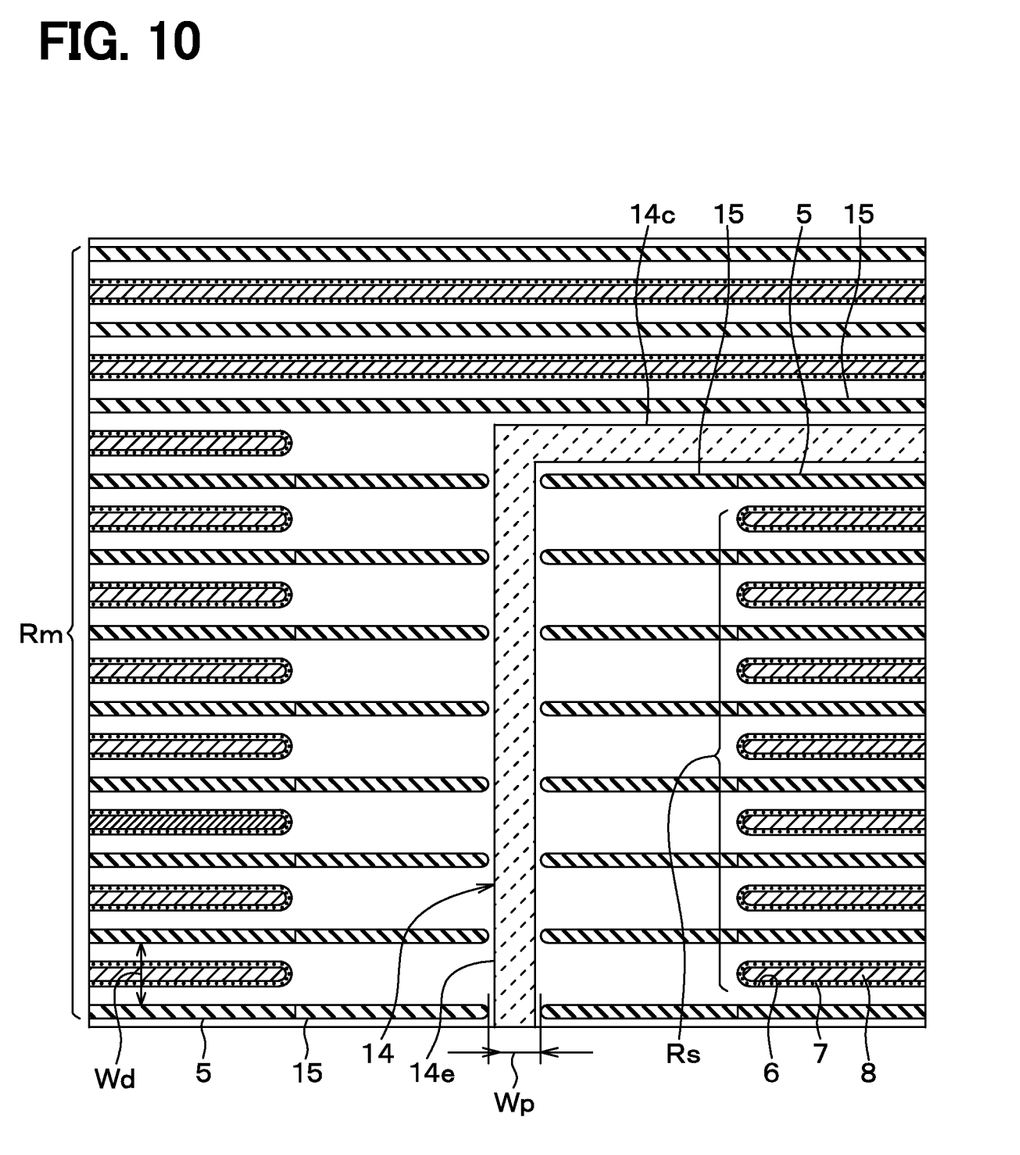
FIG. 10 is a surface layout view of a part of a cell portion of a SiC semiconductor device according to a fifth embodiment.

As shown in FIG. 10, in the present embodiment, the widths of the sides 14e and 14f of the element isolation layer 14 are also narrowed similarly to the sides 14c and 14d. Specifically, the widths of the sides 14e and 14f are smaller than the distance Wp between the electric field relaxation layer 15 protruding from the main cell region Rm side and the electric field relaxation layer 15 protruding from the sense cell region Rs side. The sides 14e and 14f are disposed to pass through between the electric field relaxation layer 15 protruding from the main cell region Rm side and the electric field relaxation layer 15 protruding from the sense cell region Rs side.

In this manner, even when the sides 14e and 14f are narrowed and disposed between the electric field relaxation layer 15 protruding from the main cell region Rm side and the electric field relaxation layer 15 protruding from the sense cell region Rs side, the element isolation effect can be achieved, and the same effects as in the first embodiment can be obtained.

Here, as described above, the epitaxial facet surface formed in the p type layer for forming the p type deep layer 5 and the electric field relaxation layer 15 may have an influence of the mask misalignment in the <11-20> direction. Therefore, it is preferable to adjust the width of the element isolation layer 14 in consideration of the influence of the mask misalignment.

In the case of the present embodiment, the element isolation layer 14 does not have a region overlapping with a portion of the electric field relaxation layer 15 that protrudes from the main cell region Rm side and a portion of the electric field relaxation layer 15 that protrudes from the sense cell region Rs as viewed in the normal direction to the surface of the semiconductor substrate. Therefore, the entire region of the element isolation layer 14 is a non-overlapping region.

Other Embodiments

Although the present disclosure is made based on the embodiments described above, the present disclosure is not limited to such embodiments but includes various changes and modifications which are within equivalent ranges. In addition, while the various elements are shown in various combinations and configurations, which are exemplary, other combinations and configurations, including more, less or only a single element, are also within the spirit and scope of the present disclosure.

(1) In the above embodiments, the p type deep layer 5 and the electric field relaxation layer 15 are formed by embedding epitaxial growth. Alternatively, they may be formed by ion implantation using a mask. In this case, the area of the ion implantation region may be reduced. Therefore, it is possible to suppress crystal damage due to ion implantation, and it is also possible to suppress leakage.

Further, the $n^+$ type source region 4 is epitaxially grown continuously on the p type base region 3. Alternatively, the n+ type source region 4 may be formed by implanting ions of n type impurity at a predetermined position of the p type base region 3.

(2) In the above embodiments, the p type deep layer 5, the electric field relaxation layer 15, and the electric field relaxation layer 22 are formed to penetrate the n+ type source region 4 and the p type base region 3. Alternatively, the p type deep layer 5 may be formed only under the p type base region 3.

(3) In the above embodiments, the n-channel type inverted trench gate MOSFET is described as an example of the vertical power element. Each of the above embodiments merely shows one example of a vertical type semiconductor element. Therefore, alternatively, a vertical type semiconductor element may have another structure and/or another conductivity type as long as the vertical type semiconductor element flows a current between a first electrode provided on the front side of the semiconductor substrate and a second electrode provided on the back side.

For example, in the first embodiment, an n channel type MOSFET in which the first conductivity type is n type and the second conductivity type is p type is described as an example. Alternatively, the conductivity type of each element may be reversed so as to form a p channel type MOSFET. In the above description, the MOSFET is described as an example of a semiconductor element. Alternatively, the present disclosure may also be applied to an IGBT having a similar structure. In the IGBT, only the conductivity type of the n+ type substrate 1 is changed from the n type to the p type with respect to each of the above embodiments, and other structures and manufacturing methods are the same as those of the above embodiments. Furthermore, the trench gate structure in the vertical type MOSFET is described as an example. Alternatively, it is not limited to a trench gate structure and may be a planar type MOSFET.

(4) In each of the above embodiments, the electric field relaxation layer 15 is connected to the p type deep layer 5. Alternatively, these may be separated from each other and configured independently. In that case, the electric field relaxation layer 15 may be arranged on the extension line of the p type deep layer 5 in the longitudinal direction. Alternatively, the electric field relaxation layer 15 may be arranged alternately with respect to the p type deep layer 5.

(5) It should be noted that, when the orientation of the crystal is to be indicated, a bar (−) should originally be attached above the desired number, but since there are restrictions on the expression based on the electronic application filing, the bar is attached before the desired number in this specification.

What is claimed is:

1. A silicon carbide semiconductor device comprising:
a main cell region;
a sense cell region;
a MOSFET arranged in each of the main cell region and the sense cell region and disposed in a semiconductor substrate which is made of silicon carbide and includes a high impurity concentration layer with a first conductivity type or a second conductivity type on a back side of the substrate and a drift layer with the first conductivity type having a lower impurity concentration than the high impurity concentration layer on a front side of the substrate;
an element isolation layer arranged between the main cell region and the sense cell region, separating the main cell region and the sense cell region, and surrounding the sense cell region; and
a plurality of electric field relaxation layers having the second conductivity type, arranged between the main cell region and the sense cell region, and disposed to be deeper than the element isolation layer, wherein:
the MOSFET includes:
a base region made of silicon carbide with the second conductivity type and arranged on the drift layer;
a source region arranged on the base region, made of silicon carbide, and having the first conductivity type with a higher impurity concentration than the drift layer;
a plurality of deep layers having the second conductive type with a higher impurity concentration and disposed deeper than the base region;
a trench gate structure in which a gate electrode is arranged through a gate insulation film in a trench which penetrates the source region and the base region;
a source electrode electrically connected to the source region and each of the deep layers; and
a drain electrode electrically connected to the high impurity concentration layer;
the deep layers and the electric field relaxation layers have a linear shape with one direction as a longitudinal direction, and are arranged in a stripe pattern at a predetermined interval;
each of the electric field relaxation layers includes at least a first portion protruding from a main cell region side to a sense cell region side and a second portion protruding from the sense cell region side to the main cell region side;
the element isolation layer is disposed deeper than the base region, and has an annular structure in which a non-overlapping region of the element isolation layer continuously surrounds the sense cell region in one turn, the non-overlapping region excluding a region of the element isolation layer overlapping with the first portion and the second portion when viewed from a normal direction to a surface of the semiconductor substrate; and
a shortest distance between the first portion and the second portion is equal to or longer than a length of a depletion layer extending from the first portion and the second portion when no bias is applied and when viewed from the normal direction, and is equal to or shorter than a predetermined distance.

2. The silicon carbide semiconductor device according to claim 1, wherein:
the first portion and the second portion are alternately arranged by being shifted in a direction orthogonal to the longitudinal direction;
the tip of the first portion is disposed between tips of the second portions; and
a side of the tip of the first portion faces a side of the tip of the second portion.

3. The silicon carbide semiconductor device according to claim 1, wherein:
the element isolation layer includes an insulation film disposed in the trench and a polysilicon layer disposed on the insulation film; and
the insulation film arranged in the element isolation layer is thicker than a gate insulation film.

4. The silicon carbide semiconductor device according to claim 1, wherein:
the element isolation layer and the trench gate structure have a same depth.

5. A silicon carbide semiconductor device comprising:
a main cell region;
a sense cell region;
a MOSFET arranged in each of the main cell region and the sense cell region and disposed in a semiconductor substrate which is made of silicon carbide and includes a high impurity concentration layer with a first conductivity type or a second conductivity type on a back side of the substrate and a drift layer with the first conductivity type having a lower impurity concentration than the high impurity concentration layer on a front side of the substrate;
an element isolation layer arranged between the main cell region and the sense cell region, separating the main cell region and the sense cell region, and surrounding the sense cell region; and
a plurality of electric field relaxation layers having the second conductivity type, arranged between the main cell region and the sense cell region, and disposed to be deeper than the element isolation layer, wherein:
the MOSFET includes:
- a base region made of silicon carbide with the second conductivity type and arranged on the drift layer;
- a source region arranged on the base region, made of silicon carbide, and having the first conductivity type with a higher impurity concentration than the drift layer;
- a plurality of deep layers having the second conductive type with a higher impurity concentration and disposed deeper than the base region;
- a trench gate structure in which a gate electrode is arranged through a gate insulation film in a trench which penetrates the source region and the base region;
- a source electrode electrically connected to the source region and each of the deep layers; and
- a drain electrode electrically connected to the high impurity concentration layer;
the deep layers and the electric field relaxation layers have a linear shape with one direction as a longitudinal direction, and are arranged in a stripe pattern at a predetermined interval;
each of the electric field relaxation layers includes at least a first portion protruding from a main cell region side to a sense cell region side and a second portion protruding from the sense cell region side to the main cell region side;
the element isolation layer is disposed deeper than the base region, and includes a pair of two sides passing between a tip of the first portion and a tip of the second portion or passing through both tips, respectively, and another pair of two sides arranged along the longitudinal direction of the deep layers and the electric field relaxation layers, the other pair of two sides being different from the pair of two sides; and
a shortest distance between the first portion and the second portion is equal to or longer than a length of a depletion layer extending from the first portion and the second portion when no bias is applied, and is equal to or less than a predetermined distance.

6. The silicon carbide semiconductor device according to claim 5, wherein:
a width of each of the other pair of two sides in the element isolation layer is wider than a predetermined distance.

7. The silicon carbide semiconductor device according to claim 5, wherein:
the tip of the first portion and the tip of the second portion are opposed to each other, and the shortest distance is defined as a distance between the tips; and
a width of each of the pair of two sides in the element isolation layer is longer than the shortest distance, and the tip of the first portion and the tip of the second portion are disposed at a bottom of each of the pair of two sides.

8. The silicon carbide semiconductor device according to claim 7, wherein:
the electric field relaxation layers are defined as first electric field relaxation layers,
the silicon carbide semiconductor device further comprising:
a second electric field relaxation layer having the second conductivity type and disposed at a position corresponding to a space between the first portion and the second portion, which is a space between adjacent first electric field relaxation layers arranged at the predetermined interval.

9. The silicon carbide semiconductor device according to claim 5, wherein:
the first portion and the second portion are alternately arranged by being shifted in a direction orthogonal to the longitudinal direction;
the tip of the first portion is disposed between tips of the second portions; and
a side of the tip of the first portion faces a side of the tip of the second portion.

10. The silicon carbide semiconductor device according to claim 5, wherein:
the element isolation layer includes an insulation film disposed in the trench and a polysilicon layer disposed on the insulation film; and
the insulation film arranged in the element isolation layer is thicker than a gate insulation film.

11. The silicon carbide semiconductor device according to claim 5, wherein:
the element isolation layer and the trench gate structure have a same depth.

* * * * *